United States Patent
Afable et al.

(10) Patent No.: US 9,443,819 B2
(45) Date of Patent: Sep. 13, 2016

(54) CLAMPING MECHANISM FOR PROCESSING OF A SUBSTRATE WITHIN A SUBSTRATE CARRIER

(71) Applicant: Apple Inc., Cupertino, CA (US)

(72) Inventors: Gerard Anthony C. Afable, Singapore (SG); Howell John Chua Toc, Singapore (SG); Prakash Venkatesappa, Singapore (SG); Kok Peng Teo, Singapore (SG); Annabelle Q. Yang, Singapore (SG)

(73) Assignee: Apple Inc., Cupertino, CA (US)

( * ) Notice: Subject to any disclaimer, the term of this patent is extended or adjusted under 35 U.S.C. 154(b) by 130 days.

(21) Appl. No.: 14/179,779

(22) Filed: Feb. 13, 2014

(65) Prior Publication Data

US 2015/0228529 A1    Aug. 13, 2015

(51) Int. Cl.
*H01L 23/00* (2006.01)
*H01L 27/146* (2006.01)

(52) U.S. Cl.
CPC ............... *H01L 24/75* (2013.01); *H01L 24/81* (2013.01); *H01L 24/83* (2013.01); *H01L 24/95* (2013.01);

(Continued)

(58) Field of Classification Search
CPC . H01L 21/68728; H01L 24/81; H01L 24/75; H01L 21/68778; H01L 21/68714–21/68735; H01L 23/13; H01L 23/3677; H01L 23/433; Y10T 29/49998; B23P 19/10
USPC ......................................................... 29/428
See application file for complete search history.

(56) References Cited

U.S. PATENT DOCUMENTS 4,195,895 A * 4/1980 Ziegler .................. H01R 4/646
174/88 R 4,767,984 A * 8/1988 Bakker ................ H05K 7/1023
206/724

(Continued)

FOREIGN PATENT DOCUMENTS

CN    201845753    5/2011
CN    102709222    10/2012

(Continued)

OTHER PUBLICATIONS

Kira, Hidehiko, et al., "New Technology for High-Density LSI Mounting in Consumer Products", *FUJITSU Sci. Tech. J.*, vol. 43, No. 1, (Jan. 2007), 41-49.

(Continued)

*Primary Examiner* — David Bryant
*Assistant Examiner* — Lawrence Averick
(74) *Attorney, Agent, or Firm* — Blakely, Sokoloff, Taylor & Zafman LLP

(57) ABSTRACT

A method and clamping apparatus for securing a substrate within a substrate carrier during an ultrasonic mounting process. The clamping apparatus may include a substrate carrier having a top plate and a bottom plate, the top plate and the bottom plate forming a cavity dimensioned to hold a substrate. A clamping plate is positioned on a side of the top plate opposite the bottom plate, the clamping plate having an opening aligned with the cavity and a pair of clamping members, each of the pair of clamping members extending toward a center of the opening and through the cavity such that the clamping member presses portions of the substrate exposed through the opening against the bottom plate. The method may include providing a clamping plate having an opening configured for alignment with a cavity formed in a substrate carrier and mounting a pair of resilient arms to the clamping plate.

14 Claims, 11 Drawing Sheets

(52) U.S. Cl.
CPC ............ *H01L 27/14618* (2013.01); *H01L 2224/73204* (2013.01); *H01L 2224/7598* (2013.01); *H01L 2224/75343* (2013.01); *H01L 2224/75704* (2013.01); *H01L 2224/81206* (2013.01); *H01L 2224/83104* (2013.01); *H01L 2224/95* (2013.01); *H01L 2924/15153* (2013.01); *Y10T 29/49826* (2015.01); *Y10T 29/49998* (2015.01)

(56) References Cited

U.S. PATENT DOCUMENTS

| | | | |
|---|---|---|---|
| 5,106,451 A * | 4/1992 | Kan | B32B 37/10 156/298 |
| 5,278,447 A | 1/1994 | Vongfuangfoo et al. | |
| 5,322,207 A | 6/1994 | Fogal et al. | |
| 5,332,463 A * | 7/1994 | Eberlein | B32B 38/1833 156/299 |
| 5,465,470 A * | 11/1995 | Vongfuangfoo | H01L 21/67126 156/300 |
| 5,611,478 A | 3/1997 | Asanasavest | |
| 5,716,493 A * | 2/1998 | Vongfuangfoo | B25B 5/06 156/300 |
| 5,836,575 A | 11/1998 | Robinson et al. | |
| 5,847,813 A | 12/1998 | Hirayanagi | |
| 6,138,891 A | 10/2000 | Evers et al. | |
| 6,285,553 B1 | 9/2001 | Suyama et al. | |
| 7,134,589 B2 | 11/2006 | Balon | |
| 7,624,492 B1 * | 12/2009 | Katsube | H01L 23/142 156/73.1 |
| 8,017,434 B2 * | 9/2011 | Lim | H01L 23/32 257/699 |
| 8,226,795 B2 | 7/2012 | Brass et al. | |
| 8,531,658 B2 * | 9/2013 | Horiuchi | G01N 21/13 356/244 |
| 8,550,443 B1 | 10/2013 | Di Stefano | |
| 8,726,494 B2 * | 5/2014 | Katsube | H01L 23/142 29/559 |
| 2002/0158396 A1 | 10/2002 | Bennett et al. | |
| 2007/0022813 A1 * | 2/2007 | Kasajima | G01P 15/18 73/514.31 |
| 2008/0017320 A1 | 1/2008 | Choi et al. | |
| 2009/0104014 A1 | 4/2009 | Satou et al. | |
| 2010/0018041 A1 * | 1/2010 | Katsube | H01L 23/142 29/760 |
| 2011/0074080 A1 | 3/2011 | Di Stefano et al. | |
| 2011/0194116 A1 * | 8/2011 | Horiuchi | G01N 21/13 356/445 |
| 2011/0290701 A1 | 12/2011 | Bennett et al. | |
| 2011/0304418 A1 | 12/2011 | Schuessler et al. | |
| 2012/0247664 A1 | 10/2012 | Kobayashi | |
| 2012/0292375 A1 | 11/2012 | Blais et al. | |

FOREIGN PATENT DOCUMENTS

| | | |
|---|---|---|
| WO | WO-2013083196 | 6/2013 |
| WO | WO-2013188519 | 12/2013 |
| WO | WO-2014114360 | 7/2014 |

OTHER PUBLICATIONS

Singapore Search Report and Written Opinion mailed Jul. 20, 2015, Singapore Appln. No. 10201504586W, 12 pages.
Singapore Search Report and Written Opinion mailed Jul. 3, 2015, Singapore Appln. No. 10201501105U, 10 pages.
Apple Inc., Written Opinion mailed Apr. 15, 2016, Singapore Appln. No. 10201501105U, 8 pages.

* cited by examiner

CLAMPING MECHANISM FOR PROCESSING OF A SUBSTRATE WITHIN A SUBSTRATE CARRIER

FIELD

An embodiment of the invention is directed to a clamping mechanism for clamping a substrate within a substrate carrier during a processing operation, more specifically, for clamping a substrate within the substrate carrier during an ultrasonic flip-chip mounting process. Other embodiments are also described and claimed.

BACKGROUND

Current camera module assembly processing involves processing of singulated leadless chip carrier (LCC) substrates. Due to the substrate's near weightless characteristic and tiny size, the assembly handling process for surface-mount technology (SMT), wash and clean, flip-chip, underfill and glass attach has become challenging. Representatively, SMT and glass attach processing is done on one side of the substrate while flip-chip and underfill is done on the other side thus a flip is required. In addition, it is difficult to hold the substrate down due to its weight and size. In particular, the substrate easily gets dislodged with vibration or air. Moreover, there is no space for, for example, use of a vacuum technique to hold the substrate in place. Conventional systems, which have tried to address these issues, include sticking a substrate to a carrier using double sided tape or mechanically clamping the substrate to a carrier. In each case, however, pick, flip and placement or transfer of the substrate from the carrier to, in some cases, another carrier, must occur after each processing step so that processing may occur on both sides of the substrate.

Flip-chip mounting technologies incorporate many different techniques for bonding a microelectronic device (e.g. an image sensor) to a substrate (e.g. a ceramic substrate). One such technique uses ultrasonic energy to bond the device to the substrate. In particular, during an ultrasonic flip-chip mounting process the substrate is clamped against a bottom carrier plate to help stabilize the substrate against movement due to the ultrasonic vibrations. The substrate may be clamped using a plate that press the substrate from the top. Metallic bumps are formed on one face of the microelectronic device and the other face is vacuum attached to an ultrasonic horn. The horn then aligns the device with the substrate and applies an ultrasonic energy that vibrates the device and causes it to bond to the substrate. During this process, it is important that the substrate be held stationary, hence the use of the plate clamping the substrate to the bottom carrier. It has further been found that sandwiching the device between the bottom carrier and a top carrier can improve the handling and robustness of the substrate. When two carriers are used, however, the plate can no longer contact and press the substrate to the bottom carrier because the top carrier is in the way. Thus, the current plate design cannot be used with a substrate carrier having a top carrier over the substrate.

SUMMARY

An embodiment of the invention is a clamping apparatus for securing a substrate within a substrate carrier during an ultrasonic mounting process. The clamping apparatus may include a substrate carrier having a top plate and a bottom plate, the top plate and the bottom plate forming a cavity dimensioned to hold a substrate. The clamping apparatus may further include a clamping plate positioned on a side of the top plate opposite the bottom plate. The clamping plate may include an opening aligned with the cavity and a pair of clamping members, each of the pair of clamping members extending toward a center of the opening and through the cavity such that when a substrate is positioned within the cavity, the clamping member presses portions of the substrate exposed through the opening against the bottom plate.

An embodiment of the invention further includes a method of assembling a clamping apparatus for securing a substrate within a substrate carrier for use during an ultrasonic mounting process. The method includes providing a clamping plate having an opening configured for alignment with a cavity formed in a substrate carrier. The method further including mounting a pair of resilient arms to the clamping plate, wherein each of the pair of resilient arms have a mounting portion dimensioned to attach to the clamping plate and a clamping portion dimensioned to extend toward a center of the opening and through the cavity to clamp a substrate to the substrate carrier when the clamping plate is positioned on the substrate carrier.

In another embodiment, a method for securing a substrate within a substrate carrier during an ultrasonic mounting process is further provided. The method may include positioning a substrate within a cavity of a substrate carrier, wherein the cavity is formed between a top carrier plate and a bottom carrier plate. The method further including positioning a clamping plate over the substrate carrier to secure the substrate within the substrate carrier during an ultrasonic mounting process, wherein the clamping plate comprises an opening aligned with the cavity and a pair of resilient arms extending toward a center of the opening and through the cavity to press the substrate against the bottom carrier plate.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1:
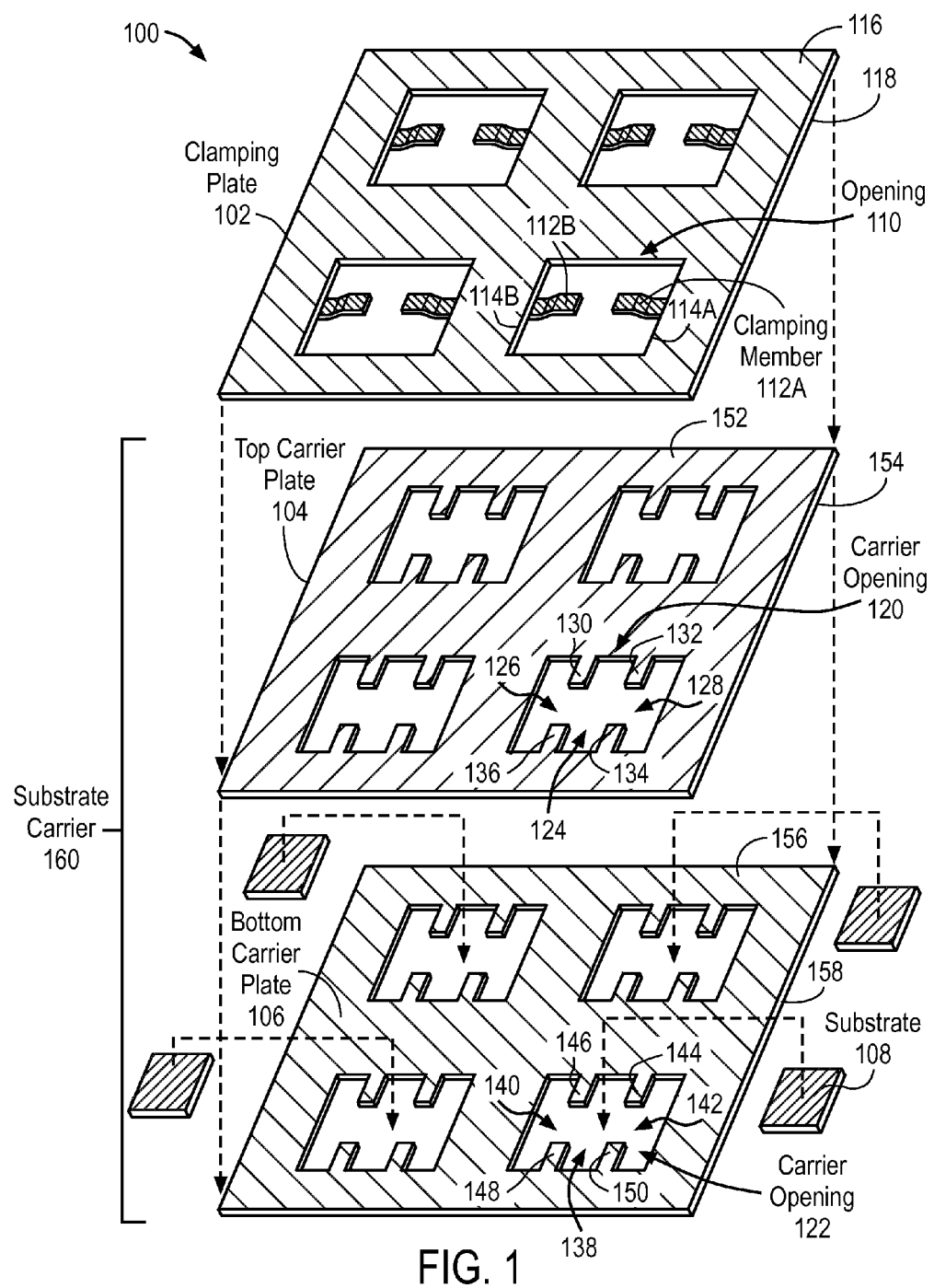
FIG. 1 illustrates an exploded top perspective view of a clamping assembly for a substrate carrier.

FIG. 1 illustrates an exploded top perspective view of a clamping assembly for a substrate carrier. Clamping assembly 100 may include a clamping plate 102 configured to clamp one or more of a substrate 108 between a top carrier plate 104 and a bottom carrier plate 106 of a substrate carrier 160. Representatively, clamping plate 102 may include one or more of opening 110 and a pair of clamping members 112A, 112B. Clamping members 112A, 112B are attached to clamping plate 102 along opposing sides 114A, 114B, respectively, of opening 110 such that they extend toward a center of opening 110. Clamping members 112A, 112B may be resilient structures, such as resilient arms or plates, which are separately attached at one end to a bottom side 118 (or a top side 116) of clamping plate 102. Each opening 110 is configured for alignment with a carrier opening 120 within top carrier plate 104 and a carrier opening 122 within bottom carrier plate 106. In this aspect, when carrier opening 120 is aligned with carrier opening 122, clamping members 112A, 112B extend into a cavity formed between carrier openings 120, 122 and press a substrate 108 held within the cavity against bottom carrier plate 106. Pressing substrate 108 against bottom carrier plate 106 helps to stabilize substrate 108 during subsequent processing operations, for example, an ultrasonic flip chip mounting process which could otherwise cause substrate 108 to shift within the substrate carrier, as will be described in more detail below.

Representatively, top carrier plate 104 and bottom carrier plate 106 may be used to form a substrate carrier 160 which holds one or more of substrate 108 within a cavity formed by carrier openings 120, 122. Substrate carrier 160 exposes both sides of one or more of substrate 108 held within the cavity for processing (e.g. surface-mount technology (SMT), wash and clean, flip-chip, underfill and glass attach) without the need for pick, flip or removal of substrate 108 from substrate carrier 160. Substrate 108 may be, for example, a ceramic substrate such as a leadless chip carrier (LCC) substrate or other similarly sized substrate that may be subjected to similar substrate processing techniques (e.g. SMT, wash and clean, flip-chip, underfill and glass attach) or other micro scale device, for example, a microelectronic device (e.g. an image sensor).

Carrier opening 120 and carrier opening 122 are further dimensioned to receive clamping members 112A, 112B of clamping plate 102. Representatively, in one embodiment, carrier opening 120 includes a substrate opening 124 and clamp openings 126, 128 on opposite sides of the substrate opening 124. The substrate opening 124 and clamp openings 126, 128 are separated by protrusions 130, 132, 134 and 136, which extend inwardly toward a center of carrier opening 120. Protrusions 130, 132, 134 and 136 may be dimensioned to help align and hold substrate 108 within substrate opening 124. In particular, each of protrusions 130, 132, 134 and 136 may overlap corners of substrate 108 along the top side of substrate 108 such that they hold substrate 108 against bottom carrier plate 106. Clamp openings 128, 126 are dimensioned to receive clamping members 112A, 112B, respectively. Representatively, in on embodiment, each of substrate opening 124 and clamp openings 128, 126 may have substantially rectangular shaped profiles. In other embodiments, substrate opening 124 and clamp openings 128, 126 may have a different shape, for example, a circular, oval or square shape. In addition, it is to be understood that although four carrier openings 120 are shown formed in top carrier plate 104, more or less may be provided depending upon the number of substrates to be processed. For example, in some embodiments, as many as 20 or more carrier openings 120 may be formed in top carrier plate 104. Still further, carrier openings 120 may be formed in an aligned pattern such that each is aligned with another as shown, or offset from one another.

Carrier opening 122 of bottom carrier plate 106 is substantially similar to carrier opening 120. Representatively, in one embodiment, carrier opening 122 includes a substrate opening 138 and clamp openings 140, 142 on opposite sides of the substrate opening 138. The substrate opening 138 and clamp openings 140, 142 are defined by protrusions 144, 146, 148 and 150, which extend inward toward a center of carrier opening 122, and also help to hold substrate 108 within substrate opening 138. In particular, each of protrusions 144, 146, 148 and 150 may overlap corners of substrate 108 along the bottom side of substrate 108 such that they hold substrate 108 against top carrier plate 104. Clamp openings 140, 142 are dimensioned to receive clamping members 112A, 112B, respectively. Representatively, in on embodiment, each of substrate opening 138 and clamp openings 140, 142 may have substantially rectangular shaped profiles. In other embodiments, substrate opening 138 and clamp openings 140, 142 may have a different shape, for example, a circular, oval or square shape. In addition, it is to be understood that although four carrier openings 122 are shown formed in bottom carrier plate 106, more or less may be provided depending upon the number of substrates to be processed. For example, in some embodiments, as many as 20 or more carrier openings 122 may be formed in bottom carrier plate 106. Still further, carrier openings 122 may be formed in an aligned pattern such that each is aligned with another as shown, or offset from one another.

It is to be understood that although only one of opening 110 in clamping plate 102, carrier opening 120 in top carrier plate 104 and carrier opening 122 of bottom carrier plate 106 are described, each of the other openings illustrated in each plate may have the same size and dimensions as those previously discussed. In addition, a pattern of each of an opening 110, carrier opening 120 and carrier opening 122 formed in the respective plates may be similar such that they align with each other when the clamping plate 102, top carrier plate 104 and bottom carrier plate 106 are stacked together with substrate 108 in between.

Each of clamping plate 102, top carrier plate 104 and bottom carrier plate 106 may be substantially planar structures which can be stacked, one on top of the other. Representatively, clamping plate 102 may have a top side 116 and a bottom side 118. Top carrier plate 104 may have a top side 152 and a bottom side 154. Bottom carrier plate 106 may have a top side 156 and a bottom side 158. When the plates 102, 104 and 106 are stacked together, bottom side 118 of clamping plate 102 contacts top side 152 of top carrier plate 104 and bottom side 154 of top carrier plate 104 contacts the top side 156 of bottom carrier plate 106. Since the plates are substantially planar, when the clamping plate 102 is positioned on the top carrier plate 104 and the top carrier plate 104 is positioned on the bottom carrier plate 106, each plate is within an entirely separate plane. In addition, clamping plate 102, top carrier plate 104 and bottom carrier plate 106 may have substantially the same footprint. In other words, an overall size and shape of the clamping plate 102, top carrier plate 104 and bottom carrier plate 106 is substantially the same.

Top carrier plate 104 and bottom carrier plate 106 may be made of any material suitable for processing of a substrate held therein. Representatively, top carrier plate 104 and/or bottom carrier plate 106 may be made of a metallic material, for example, a ferromagnetic metallic material such that the plates can be magnetically held together, or other material and the plates can be mechanically clamped together.

Figure 2:
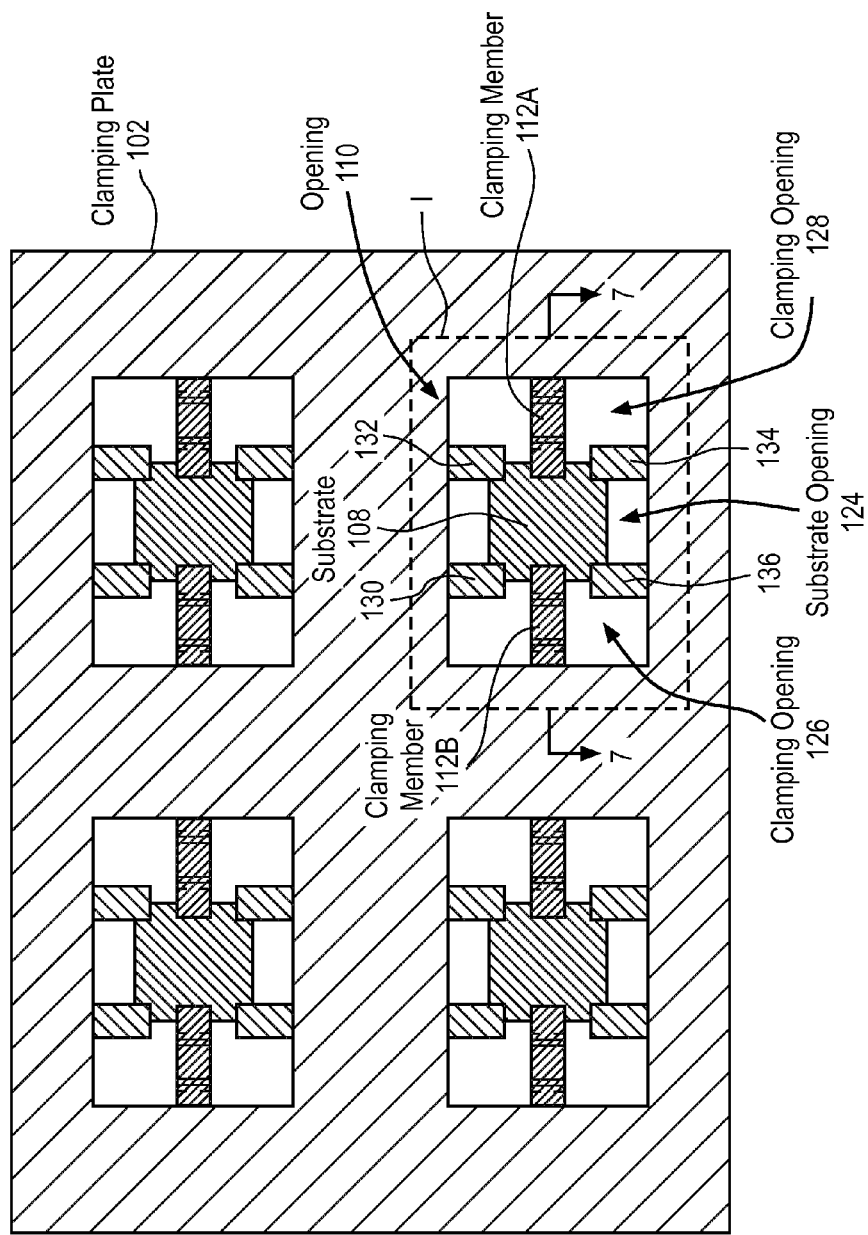
FIG. 2 illustrates a top plan view of the clamping assembly of FIG. 1.

FIG. 2 illustrates a top plan view of the clamping assembly of FIG. 1. From this view, it can be seen that when clamping plate 102, top carrier plate 104 and bottom carrier plate 106 are stacked together, clamping members 112A, 112B are positioned within clamp openings 128, 126, respectively, of top carrier plate 104. In addition, clamping members 112A, 112B are positioned over sides of substrate 108 thereby pressing portions of substrate 108 exposed through opening 110 against bottom carrier plate 106 (not shown). Protrusions 130, 132, 134 and 136 of top carrier plate 104 can also be seen overlapping corners of a top side of substrate 108 in order to hold substrate 108 within substrate opening 124.

Figure 3:
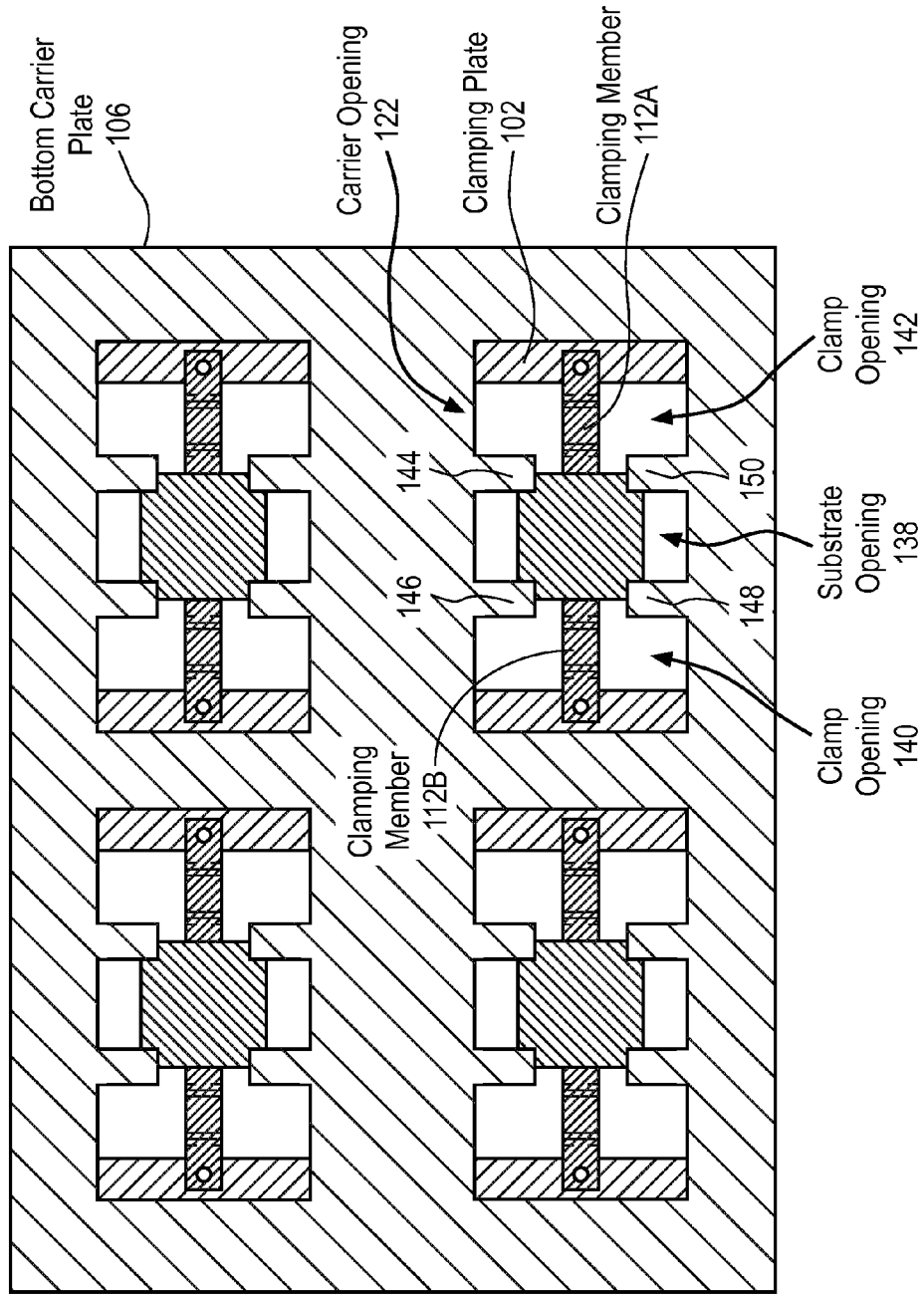
FIG. 3 illustrates a bottom plan view of the clamping assembly of FIG. 1.

FIG. 3 illustrates a bottom plan view of the clamping assembly of FIG. 1. Looking at clamping assembly 100 from the bottom, it can be seen that clamping members 112A, 112B are positioned within clamp openings 142, 140, respectively, of bottom carrier plate 106. In addition, clamping members 112A, 112B are positioned over the top sides of substrate 108 to press substrate 108 against bottom carrier plate 106. In addition, it can be seen that protrusions 144, 146, 148 and 150 of bottom carrier plate 106 overlap corners of the bottom side of substrate 108 in order to hold substrate 108 within substrate opening 138. In this aspect, the corners of substrate 108 are held between protrusions 130, 132, 134 and 136 along a top side and protrusions 144, 146, 148 and 150 along a bottom side. It is noted that since only the corners and a small surface area along the top side of the substrate 108 are covered by protrusions 130, 132, 134, protrusions 144, 146, 148 and 150 and clamping members 112A, 112B, a maximum surface area of substrate 108 is exposed for processing.

Figure 4:
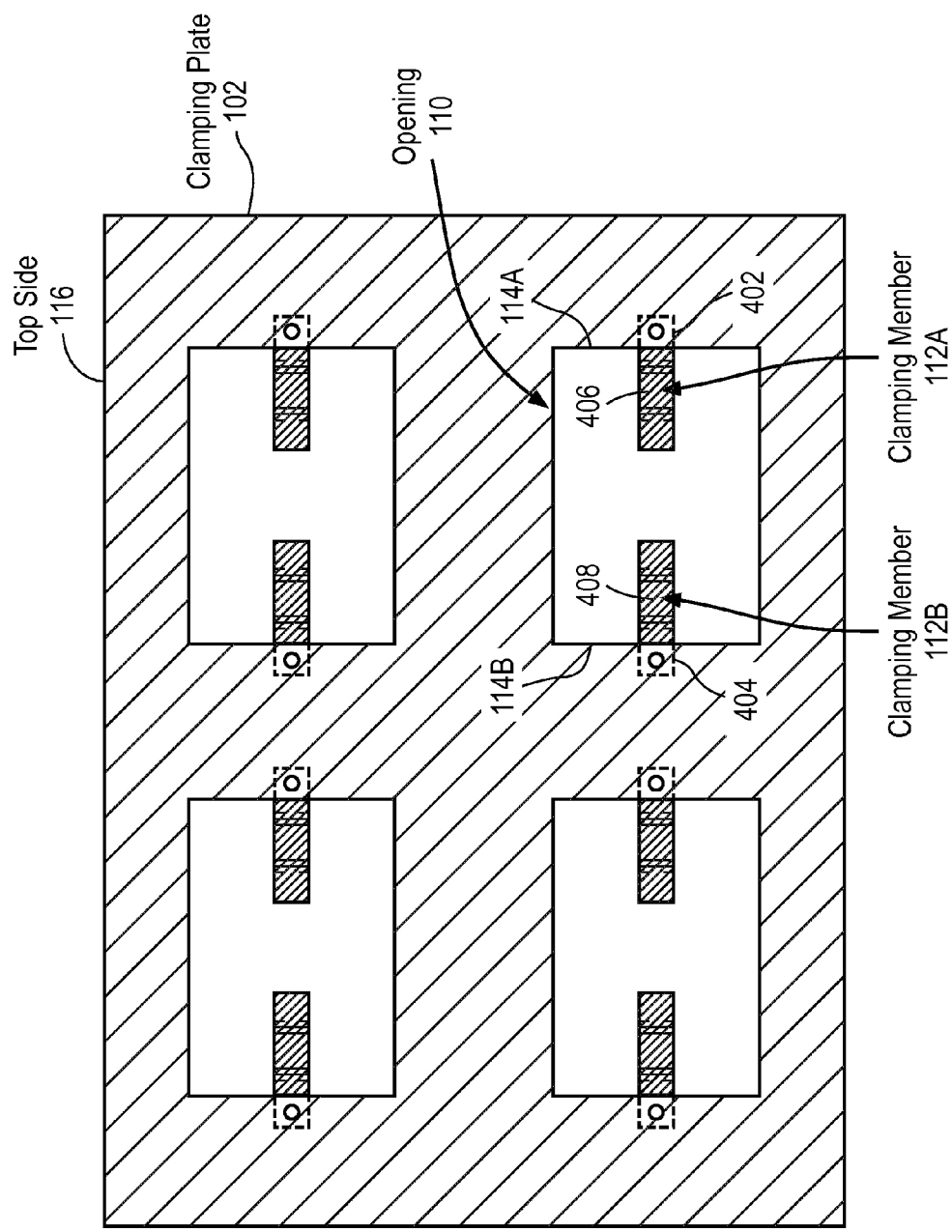
FIG. 4 illustrates a top plan view of a clamping plate of the clamping assembly of FIG. 1.

FIG. 4 illustrates a top plan view of a clamping plate of the clamping assembly of FIG. 1. As previously discussed, clamping plate 102 includes one or more of opening 110. For example, in one embodiment, up to 20 or more of opening 110 may be formed in clamping plate 102. Each opening 110 may have substantially the same size and shape, or a different size and shape than another opening, depending upon the shape and size of the openings formed within substrate carrier 160 (e.g. openings 120, 122) and the substrate to be held therein. Representatively, in one embodiment, each opening 110 may have a substantially rectangular shape. Alternatively, each opening 110 may have a square, elliptical or circular shape. Clamping members 112A, 112B are shown mounted at one end, for example, a mounting end 402, 404, respectively, to clamping plate 102. The other end, for example, a clamping end 406, 408, of each of clamping members 112A, 112B, respectively, is positioned within opening 110 such that they overlap, and press against, sides of a substrate positioned within the underlying substrate carrier. In this aspect, clamping members 112A, 112B may be elongated arm like structures which extend into the opening toward one another. In some embodiments, clamping members 112A, 112B may have a length dimension such that they extend into the opening 110 toward one another but do not touch. Rather, there is a gap between the clamping end 406, 408 such that they overlap only edges of the underlying substrate and therefore allow for processing of nearly the entire surface area of the substrate that is exposed through opening 110.

As previously discussed, clamping plate 102 may be a substantially planar plate with each of clamping members 112A, 112B separately attached to clamping plate 102. Clamping members 112A, 112B may be made of a resilient material and structure that can press against an underlying substrate 108. In one embodiment, clamping plate 102 and clamping members 112A, 112B may be made of different materials. For example, clamping plate 102 may be made of a metal material and clamping members 112A, 112B may be made of a different type of metal material. Representatively, clamping plate 102 may be made of a metal alloy such as stainless steel and clamping members 112A, 112B may be made of a copper material, for example, copper beryllium, or other metal material having a resilient property. Alternatively, clamping plate 102 and one or more of clamping members 112A, 112B may be made of the same material, for example, copper beryllium. In addition, although each opening 110 is shown having two clamping members 112A, 112B, it is to be understood that in some embodiments, more than two clamping members 112A, 112B may be attached to clamping plate 102. For example, four clamping members 112A, 112B may extend into each opening 110, for example, one from each side such that one clamping member extends from each side of opening 110.

Figure 5:
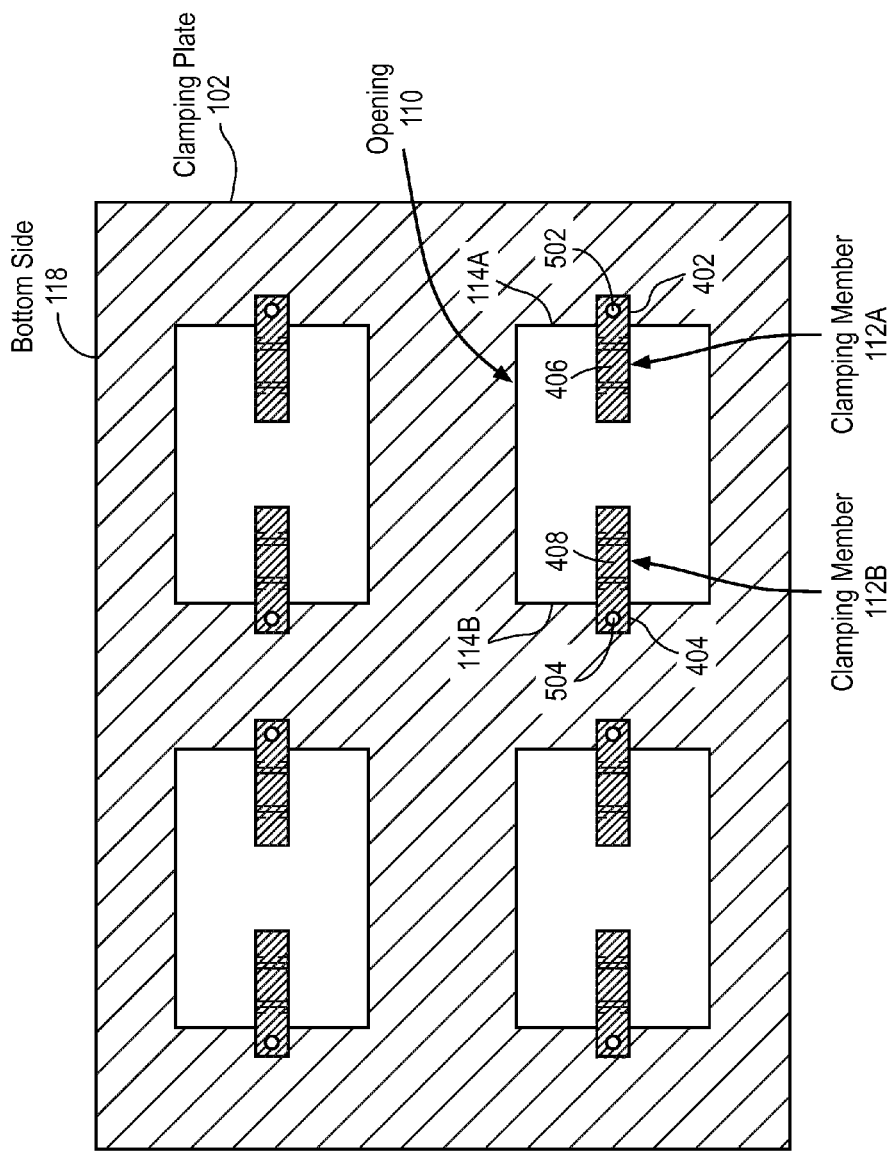
FIG. 5 illustrates a bottom plan view of a clamping plate of the clamping assembly of FIG. 1.

FIG. 5 illustrates a bottom plan view of a clamping plate of the clamping assembly of FIG. 1. From this view, it can be seen that each mounting end 402, 404 of clamping members 112A, 112B, respectively, is separately mounted to a bottom side 118 of clamping plate 102. For example, in one embodiment, each of mounting end 402, 404 is mounted to the bottom side 118 of clamping plate using fasteners 502, 504. Fasteners 502, 504 may be, for example, screws, bolts, or other similar attachment mechanisms. Since clamping members 112A, 112B are mounted to a bottom side 118 (or, in some cases, a top side) of clamping plate 102, at least a portion (e.g. mounting end 402, 404) of clamping members 112A, 112B is in a different plane than clamping plate 102.

Figure 6A:
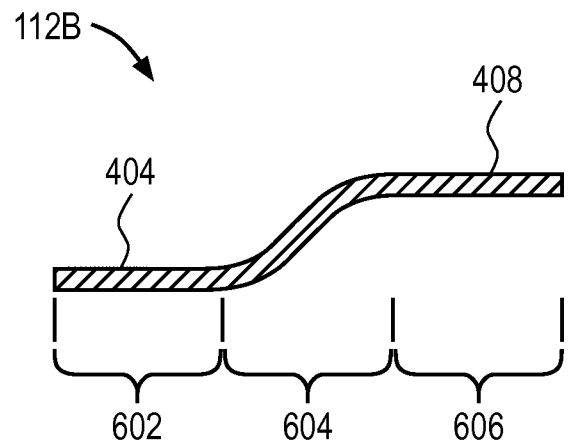
FIG. 6A illustrates a magnified cross sectional view of a clamping member of the clamping plate of FIG. 1.

FIG. 6A illustrates a magnified cross sectional view of a clamping member of one embodiment of the clamping plate of FIG. 1. As previously discussed, clamping members 112A, 112B may be resilient arm members which can press an underlying substrate (e.g. substrate 108) against a bottom carrier (e.g. bottom carrier 106) of a substrate carrier (e.g.

substrate carrier 160). Thus, in one embodiment, clamping members 112A, 112B are configured such that they have a resilient structure. Representatively, clamping member 112B may be a resilient arm that includes a mounting portion 602 that is substantially planar and may be mounted to clamping plate 102 at mounting end 404, as previously discussed. The other end may be considered the clamping portion 606 since it includes the clamping end 408 that will be used to contact and clamp the substrate. The clamping portion 606 is also a substantially planar portion. Between the mounting portion 602 and the clamping portion 606 is a bent portion 604 that causes the mounting portion 602 and the clamping portion 606 to lie in separate planes. In one embodiment, the bent portion 604 is an "S" shaped, or upward, bend such that the clamping portion 606 is in a plane above the mounting portion 602. In this aspect, when the mounting end 404 of the mounting portion 602 is mounted to the bottom side of clamping plate 102, the clamping portion 606 bends over a top side of the substrate so that clamping end 408 can press the substrate down against the bottom carrier plate 106. These features will be described in more detail in reference to FIG. 7.

Figure 6B:
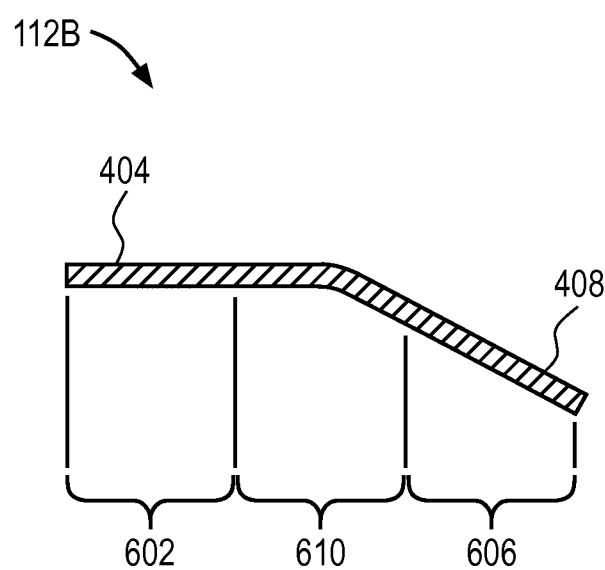
FIG. 6B illustrates a magnified cross sectional view of a clamping member of the clamping plate of FIG. 1.

FIG. 6B illustrates a magnified cross sectional view of another embodiment of a clamping member of the clamping plate of FIG. 1. In this embodiment, clamping member 112B is shown with a slightly different configuration than that of FIG. 6A. Representatively, clamping member 112B includes mounting portion 602 and clamping portion 606 which are substantially planar members as previously discussed, except in this embodiment, bent portion 610 bends in a different direction. In particular, bent portion 610 forms a downward bend (e.g. a downward bend) such that the clamping end 408 of clamping portion 606 is in a plane vertically downward from that of the mounting end 404 of mounting portion 602. Thus, according to this embodiment, when mounting end 404 is mounted to clamping plate 102, clamping portion 606 extends inward toward a center of the corresponding opening (e.g. opening 110) and downward toward the underlying substrate (e.g. substrate 108). This embodiment will be described in more detail in reference to FIG. 9.

Figure 7:
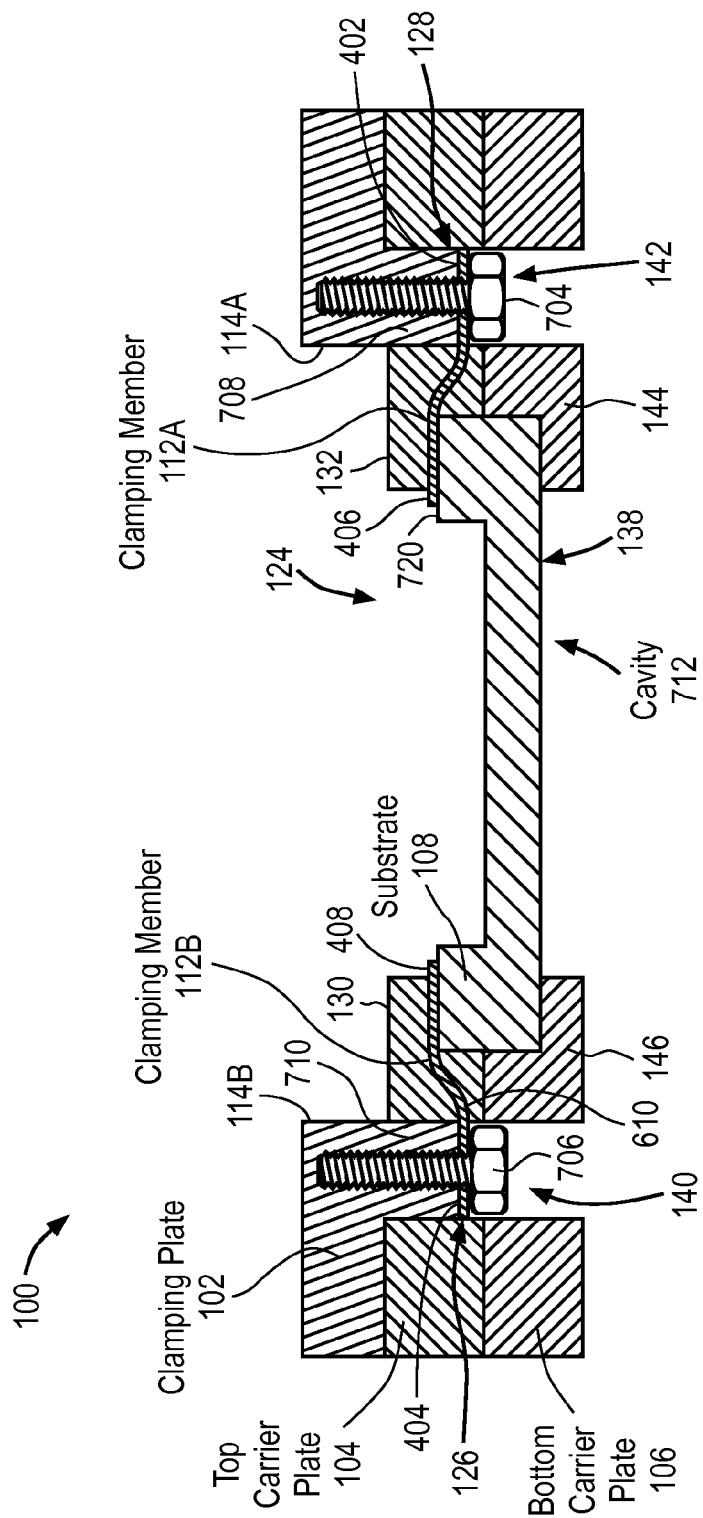
FIG. 7 illustrates a cross sectional view of portion I of one embodiment of the clamping assembly of FIG. 2 along line 7-7.

FIG. 7 illustrates a cross sectional view of portion I of one embodiment of the clamping assembly of FIG. 2 along line 7-7. From this view, it can be seen that when substrate opening 124 of top carrier plate 104 and substrate opening 138 of bottom carrier plate 106 are aligned with one another, they form a substrate cavity 712. Substrate cavity 712 is formed between top carrier plate 104 and bottom carrier plate 106. Cavity 712 is formed between, for example, carrier opening 120 of top carrier plate 104 and carrier opening 122 of bottom carrier plate 106 when the plates are stacked one on top of the other. More specifically, cavity 712 may be formed between bottom sides of protrusions 130, 132 (and also protrusions 134, 136, although not shown) of top carrier plate 104 and top sides of protrusions 144, 146 (and also protrusions 148, 150, although not shown) of bottom carrier plate 106 which define the substrate openings 124, 138, respectively. For example, each of protrusions 130, 132, 134, 136 and protrusions 144, 146, 148, 150, may have recessed portions along the side facing substrate 108. The recessed portions may form pockets between protrusions 130, 132, 134, 136 and protrusions 146, 144, 150, 148, respectively, which are dimensioned to receive the top side or bottom side of corners of substrate 108. When substrate 108 is positioned within cavity 712, the clamping end 406, 408 of clamping members 112A, 112B, respectively, extend into cavity 712 and contact the top surface 720 of substrate 108. Clamping members 112A, 112B press substrate 108 toward bottom carrier plate 106. From this view, it can further be seen that substrate 108 is aligned within cavity 712 by protrusions 130, 132 of top carrier plate 102 and protrusions 144, 146 of bottom carrier plate 106.

In one embodiment, clamping members 112A, 112B may be secured to the bottom side of clamping plate 102 using fasteners 704, 706, respectively. Fasteners 704, 706 may be any type of fastener suitable for fixedly attaching clamping members 112A, 112B to clamping plate 102. Representatively, in one embodiment, fasteners 704, 706 may be bolts, screws, pins, or the like. In some embodiments, clamping plate 102 may include downwardly extending mounting arms 708, 710 which extend into clamp openings 128, 126 of top carrier plate 104, and in some cases, clamp openings 142, 140, of bottom carrier plate 106, respectively. In this aspect, mounting members 112A, 112B may be similarly shaped to the mounting member described in reference to FIG. 6A. Representatively, mounting members 112A, 112B may be mounted to mounting arms 708, 710 such that the mounting ends 402, 404 are below the top side 720 of substrate 108 and the bent portion 610 bends the clamping ends 406, 408 over the top side 720 of substrate 108. The downward tension placed on mounting members 112A, 112B due to the clamping plate 102 and shape of mounting members 112A, 112B presses substrate 108 against bottom carrier plate 106. In this aspect, mounting members 112A, 112B help to hold substrate 108 in place against bottom carrier 106 during subsequent processing operations. One such processing operation is described in reference to FIG. 8.

Figure 8:
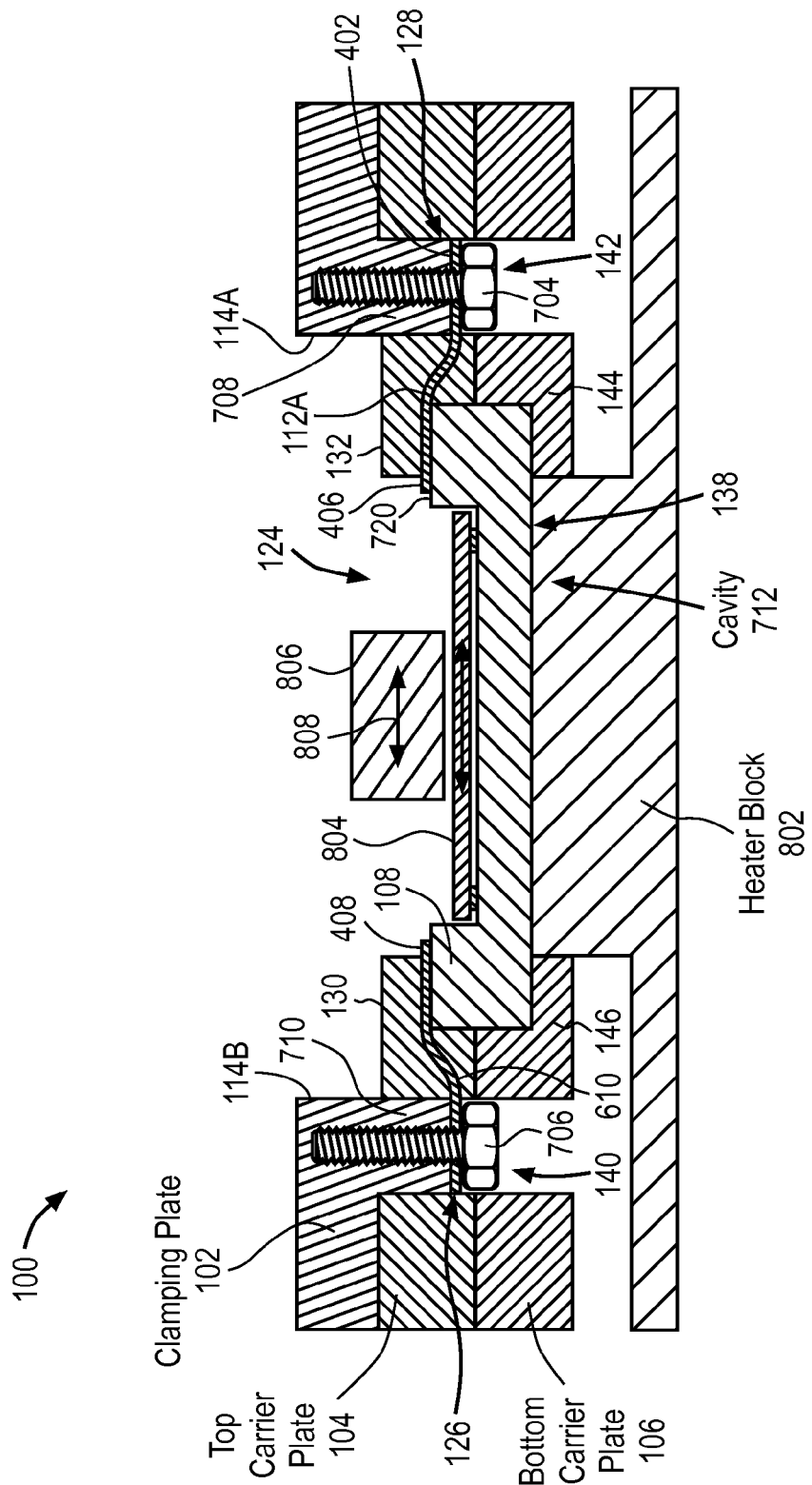
FIG. 8 illustrates the clamping assembly of FIG. 7 during an ultrasonic flip chip mounting process.

In particular, FIG. 8 illustrates the clamping assembly of FIG. 7 during an ultrasonic flip chip mounting process. Representatively, during an ultrasonic flip chip mounting process, carrier assembly 100 is positioned on top of a heater block 802 such that the bottom side of substrate 108 faces heater block 802. A device 804, for example, a microelectronic device (e.g. an image sensor) is placed on the top side of substrate 108. In order to bond device 804 to substrate 108, an ultrasonic vibrator 806 is placed on top of device 804. Ultrasonic vibrator 806 is configured to apply ultrasonic vibrations in a direction of arrow 808 to device 804. Since substrate 108 is secured to bottom carrier plate 106 using clamping members 112A, 112B as previously discussed, substrate 108 remains substantially stationary while device 804 moves in the direction of arrow 808. In the absence of clamping plate 102, substrate 108 could shift causing misalignment of device 804 with substrate 108. This ultrasonic energy creates metallic joints between the device 804 and substrate 108. Once device 804 is mounted to substrate 108, ultrasonic vibrator 804 can be removed.

Figure 9:
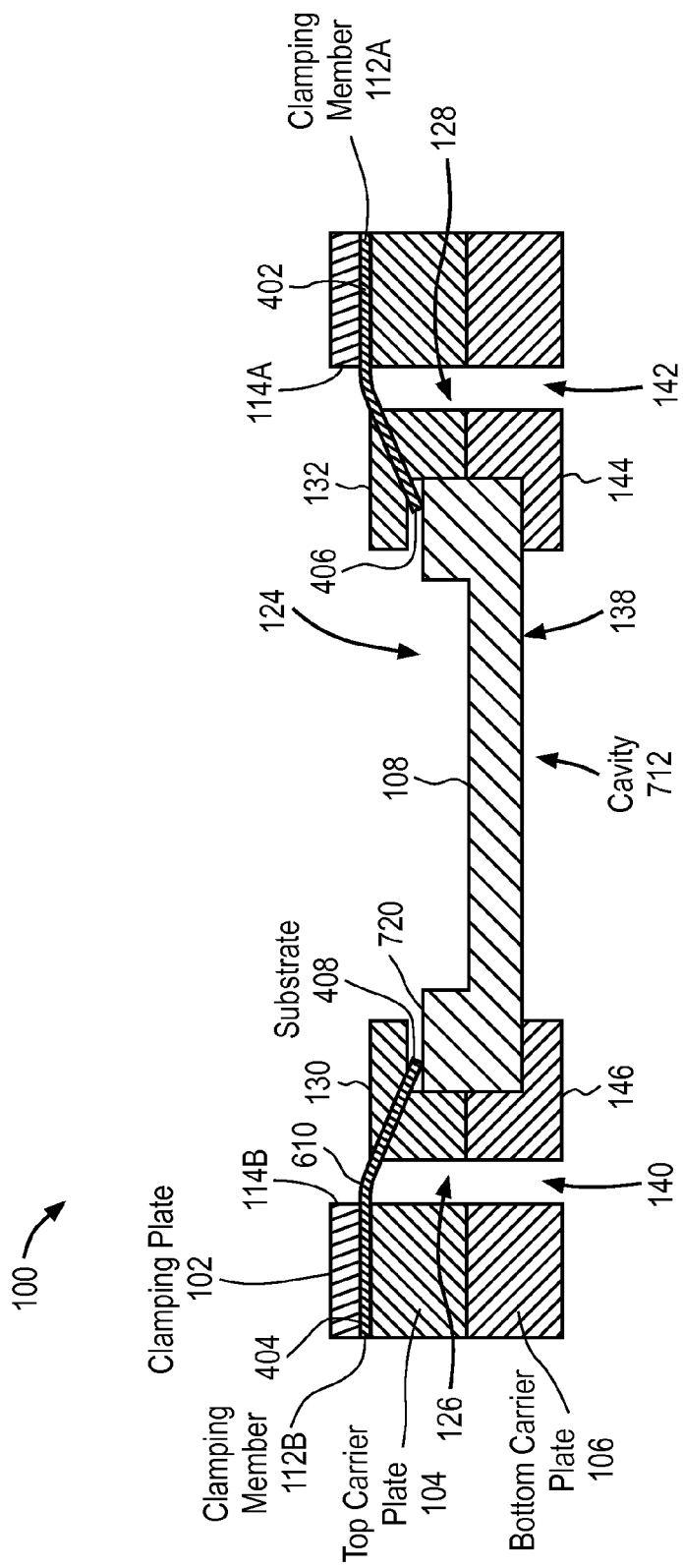
FIG. 9 illustrates a cross sectional view of portion I of another embodiment of the clamping assembly of FIG. 2 along line 7-7.

FIG. 9 illustrates a cross sectional view of portion I of another embodiment of the clamping assembly of FIG. 2 along line 7-7. Clamping assembly 100 is substantially similar to that discussed in reference to FIG. 8 except in this embodiment clamping members 112A, 112B have a shape similar to that described in reference to FIG. 6B. In particular, the bent portion 610 bends clamping members 112A, 112B downward in a direction of substrate 108. Thus, in this embodiment, the mounting ends 402, 404 are mounted to a bottom side of clamping plate 102 and are positioned vertically above substrate 108. The bent portion 610 then bends the clamping members 112A, 112B in the downward direction such that the clamping ends 406, 408 extend into cavity 712. In this aspect, clamping ends 406, 408 contact, and press down on, a top side 720 of substrate 108 and press substrate 108 against bottom carrier 106. Clamping members 112A, 112B therefore secure substrate 108 against bottom carrier 106 during subsequent processing operations. One such processing operation is an ultrasonic mounting process such as that previously described in reference to FIG. 8. For example, a device such as a microelectronic device (e.g. image sensor device) may be placed on a top side of substrate 108 and an ultrasonic vibrator used to bond the device to substrate 108 as previously discussed.

Figure 10:
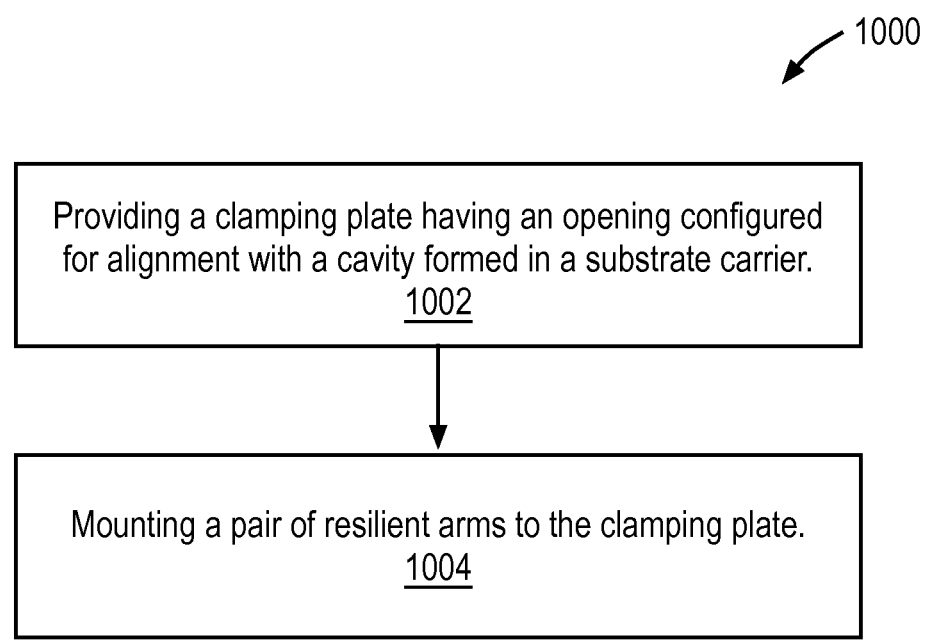
FIG. 10 is a block diagram illustrating a process of assembling a clamping apparatus.

FIG. 10 is a block diagram illustrating a process of assembling a clamping apparatus. Representatively, in one embodiment, the assembly process 1000 may include providing a clamping plate (e.g. clamping plate 102) having openings (e.g. opening 110) for alignment with a cavity formed in a substrate carrier (e.g. substrate carrier 160) (block 1002). A pair of resilient arms (e.g. clamping members 112A, 112B) may be mounted to the clamping plate (block 1004). Representatively, a mounting end of the resilient arms may be screwed or bolted to opposing sides of the opening such that a clamping portion extends toward a center of the opening and through the cavity of the substrate carrier. In this aspect, when a substrate is positioned within the cavity of the substrate carrier, the clamping members press the substrate against the substrate carrier to secure the substrate during subsequent processing operations (e.g. ultrasonic flip-chip mounting).

Figure 11:
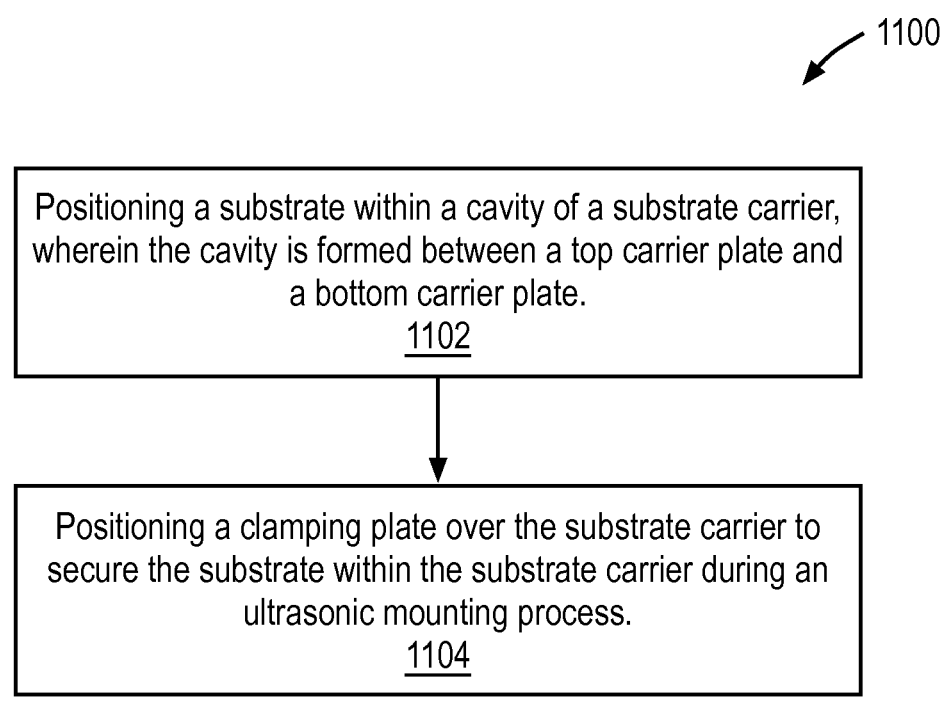
FIG. 11 is a block diagram illustrating a process for securing a substrate within a substrate carrier.

FIG. 11 is a block diagram illustrating a process for securing a substrate within a substrate carrier. Representatively, in one embodiment, the securing process 1100 may include positioning a substrate (e.g. substrate 108) within a cavity of a substrate carrier (e.g. substrate carrier 160) (block 1102). The substrate carrier may include a top carrier plate (e.g. top carrier plate 104) and a bottom carrier plate (e.g. bottom carrier plate 106) such that the substrate is sandwiched between the plates. The plates may be secured together using any suitable securing mechanism, for example, magnetic or mechanical attachment mechanisms. A clamping plate (e.g. clamping plate 102) may be positioned over the substrate carrier to secure the substrate within the substrate carrier during an ultrasonic mounting process (block 1104). The clamping plate may include an opening, which is aligned with the cavity and a pair of resilient arms extending toward a center of the opening and through the cavity to press the substrate against the bottom carrier plate. The clamping plate may be secured to the substrate carrier using any suitable securing mechanism, for example, a clamping assembly or magnetic assembly.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. A clamping apparatus for securing a substrate within a substrate carrier during an ultrasonic mounting process, the apparatus comprising:
    a substrate carrier having a top plate and a bottom plate, the top plate having a first side and a second side, the first side faces a direction opposite to that of the second side, and wherein when the first side of the top plate is positioned on the bottom plate, the top plate and the bottom plate form a cavity dimensioned to hold a substrate within the cavity; and
    a clamping plate dimensioned to be positioned on the second side of the top plate, the clamping plate having an opening that aligns with the cavity and a pair of clamping members, each of the pair of clamping members dimensioned to extend toward a center of the opening and through the cavity such that when a substrate is positioned within the cavity, the clamping member presses portions of the substrate exposed through the opening against the bottom plate.

2. The apparatus of claim 1 wherein each of the pair of clamping members have a resilient arm individually attached to the clamping plate.

3. The apparatus of claim 1 wherein the clamping plate comprises a different material than the pair of clamping members.

4. The apparatus of claim 1 wherein the clamping members are made of copper beryllium.

5. The apparatus of claim 1 wherein each of the pair of clamping members have a first portion mounted to a bottom side of the clamping plate, a second portion positioned within the cavity and a bent portion between the first portion and the second portion.

6. The apparatus of claim 1 wherein each of the pair of clamping members are mounted to portions of the clamping plate along opposite sides of the opening.

7. The apparatus of claim 1 wherein the cavity comprises a substrate opening positioned between a first clamping member opening and a second clamping member opening, the substrate opening dimensioned to expose opposing sides of a substrate positioned therein, and the first and second clamping member openings dimensioned to receive portions of the pair of clamping members.

8. A clamping apparatus for securing a substrate within a substrate carrier during an ultrasonic mounting process, the apparatus comprising:
    a substrate carrier having a top plate and a bottom plate, the top plate and the bottom plate forming a cavity dimensioned to hold a substrate within the cavity; and
    a clamping plate having a pair of clamping members, the clamping plate having an opening extending entirely through the clamping plate that aligns with the cavity, each of the pair of clamping members extending toward a center of the opening and through the cavity such that when a substrate is positioned within the cavity and the clamping plate is positioned on the top plate, the clamping member presses portions of the substrate exposed through the opening against the bottom plate.

9. The apparatus of claim 8 wherein the top plate comprises a first side and a second side, the first side faces a direction opposite to that of the second side, and wherein the first side of the top plate is positioned on the bottom plate to form the cavity dimensioned to hold the substrate within the cavity.

10. The apparatus of claim 8 wherein the top plate comprises a first side and a second side, and wherein the first side of the top plate is positioned on the bottom plate to form the cavity dimensioned to hold the substrate within the cavity and the clamping plate is positioned on, and is in contact with, the second side of the top plate.

11. The apparatus of claim 8 wherein at least one of the clamping members forming the pair of clamping members comprises an integrally formed resilient member having a mounting portion, a clamping portion, and a bent portion connecting the mounting portion and the clamping portion.

12. The apparatus of claim 8 wherein at least one of the clamping members forming the pair of clamping members comprises a mounting portion mounted to a bottom side of the clamping plate and a clamping portion that bends over a top side of the substrate exposed through the opening in the clamping plate.

13. The apparatus of claim 8 wherein at least one of the clamping members forming the pair of clamping members comprises a planar mounting portion and a planar clamping portion, the planar mounting portion is mounted to the clamping plate and the planar clamping portion extends from the planar mounting portion in a direction away from the clamping plate.

14. A clamping apparatus for securing a substrate within a substrate carrier during an ultrasonic mounting process, the apparatus comprising:
   a substrate carrier having a top plate and a bottom plate, the top plate having a first side and a second side, the first side faces a direction opposite to that of the second side, and wherein when the first side of the top plate is positioned on the bottom plate, the top plate and the bottom plate form a cavity dimensioned to hold a substrate within the cavity; and
   a clamping plate dimensioned to be positioned on the second side of the top plate, the clamping plate having an opening extending entirely through the clamping plate that aligns with the cavity and a pair of clamping members, each of the pair of clamping members dimensioned to extend toward a center of the opening and through the cavity such that when a substrate is positioned within the cavity, the clamping member presses portions of the substrate exposed through the opening against the bottom plate.

* * * * *